(12) United States Patent
Gregory et al.

(10) Patent No.: US 10,455,719 B2
(45) Date of Patent: Oct. 22, 2019

(54) SYSTEMS AND METHODS FOR ATTACHING PRINTED CIRCUIT BOARD TO PALLET

(71) Applicant: Western Digital Technologies, Inc., San Jose, CA (US)

(72) Inventors: Landdell Gregory, Penang (MY); Dinesh Segar Gnanasagaran, Kuala Lumpur (MY)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/823,503

(22) Filed: Nov. 27, 2017

(65) Prior Publication Data

US 2019/0160570 A1    May 30, 2019

(51) Int. Cl.
  *B23K 3/00*   (2006.01)
  *H05K 13/00*  (2006.01)
  *H05K 7/14*   (2006.01)

(52) U.S. Cl.
  CPC ......... *H05K 7/1405* (2013.01); *H05K 7/1402* (2013.01); *H05K 7/1417* (2013.01); *H05K 13/0069* (2013.01)

(58) Field of Classification Search
  None
  See application file for complete search history.

(56) References Cited

U.S. PATENT DOCUMENTS

| | | | | |
|---|---|---|---|---|
| 4,759,488 A | * | 7/1988 | Robinson | B23K 3/087 228/43 |
| 5,501,436 A | * | 3/1996 | Miller | B23Q 3/186 269/254 CS |
| 6,164,634 A | * | 12/2000 | Farlow | H05K 13/0069 269/47 |
| 6,164,636 A | * | 12/2000 | Taylor | H05K 13/0069 269/287 |
| 6,813,161 B2 | * | 11/2004 | Le | H05K 7/142 174/138 G |
| 7,539,021 B2 | * | 5/2009 | Peng | H05K 9/00 361/752 |
| 7,578,046 B2 | * | 8/2009 | Vigil | G01R 31/2808 29/564 |
| 7,891,502 B2 | * | 2/2011 | Chien | H05K 13/0069 211/41.17 |
| 8,737,084 B2 | * | 5/2014 | Liu | H05K 7/1417 361/732 |

OTHER PUBLICATIONS

"SMT Active Pin for Reflow fixture and Pallet"; http://detail.en.china.cn/provide/p150642614.html; 3 pages.

* cited by examiner

*Primary Examiner* — Dimary S Lopez Cruz
(74) *Attorney, Agent, or Firm* — Loza & Loza, LLP; Gabriel Fitch

(57) ABSTRACT

Aspects of the disclosure provide a pallet and a method for supporting a printed circuit board (PCB) during a circuit board assembly process. The pallet includes a panel having a frame area surrounding a depression area for receiving a PCB. The pallet includes at least one fixed tooling pin attached to the panel at a first location in the depression area. The pallet further includes at least one movable tooling pin positioned at a second location in the depression area, and the movable tooling pin is movable between a release position for installing the PCB in the depression area and a secure position for securing the PCB in the depression area.

13 Claims, 9 Drawing Sheets

SYSTEMS AND METHODS FOR ATTACHING PRINTED CIRCUIT BOARD TO PALLET

FIELD

Aspects of the present disclosure relate generally to apparatus and methods for assembling a printed circuit board (PCB) assembly and particularly to a pallet that supports a PCB during a circuit board assembly process.

BACKGROUND

A circuit board assembly process typically starts with a bare printed circuit board (PCB) that has one or more layers of wiring and exposed pads on its outside surfaces. The PCB is loaded into a solder printing machine to print solder paste on the exposed pads on the PCB using a printing stencil. Solder provides the electrical connections between the pads of the PCB and the electronic components to be placed on the PCB. After application of the solder paste, the PCB may be conveyed to a pick-n-place machine that places various components (e.g., electronical components and mechanical parts) in predetermined positions on the PCB. Then the PCB with the components goes through an oven where the solder is melted and then allowed to cool so that the components are securely soldered to the PCB. To facilitate the above described process, the PCB may be supported on a solder pallet (or simply called "pallet") during the process.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

One aspect of the disclosure provides a pallet for supporting a printed circuit board (PCB) in a PCB assembly process. The pallet includes a panel having a frame area surrounding a depression area for receiving a PCB. The pallet further includes at least one fixed tooling pin attached to the panel at a first location in the depression area. The pallet further includes at least one movable tooling pin positioned at a second location in the depression area, the movable tooling pin being movable between a release position for installing the PCB in the depression area and a secure position for securing the PCB in the depression area.

Another aspect of the disclosure provides a method of supporting a printed circuit board (PCB) using a pallet that includes a panel having a frame area surrounding a depression area for receiving a PCB. The method sets at least one movable tooling pin positioned at a first location in the depression area in a release position. The method aligns a first tooling hole of the PCB with a fixed tooling pin attached to the panel at a second location in the depression area. The method aligns a second tooling hole of the PCB with the movable tooling pin set in the release position. The method installs the PCB into the depression area guided by the fixed tooling pin and the movable tooling pin. The method sets the movable tooling pin to a secure position and thereby securing the PCB to the pallet.

Another aspect of the disclosure provides a method of assembling a printed circuit board (PCB). The method secures a PCB panel on a pallet using a method described in this disclosure. The method moves the PCB panel secured on the pallet through a PCB assembly line and releases the PCB panel from the pallet. The method may use a robotic arm to move or operate a movable tooling pin of the pallet from a release position to a secure position to secure the PCB on the pallet.

DETAILED DESCRIPTION

Figure 1:
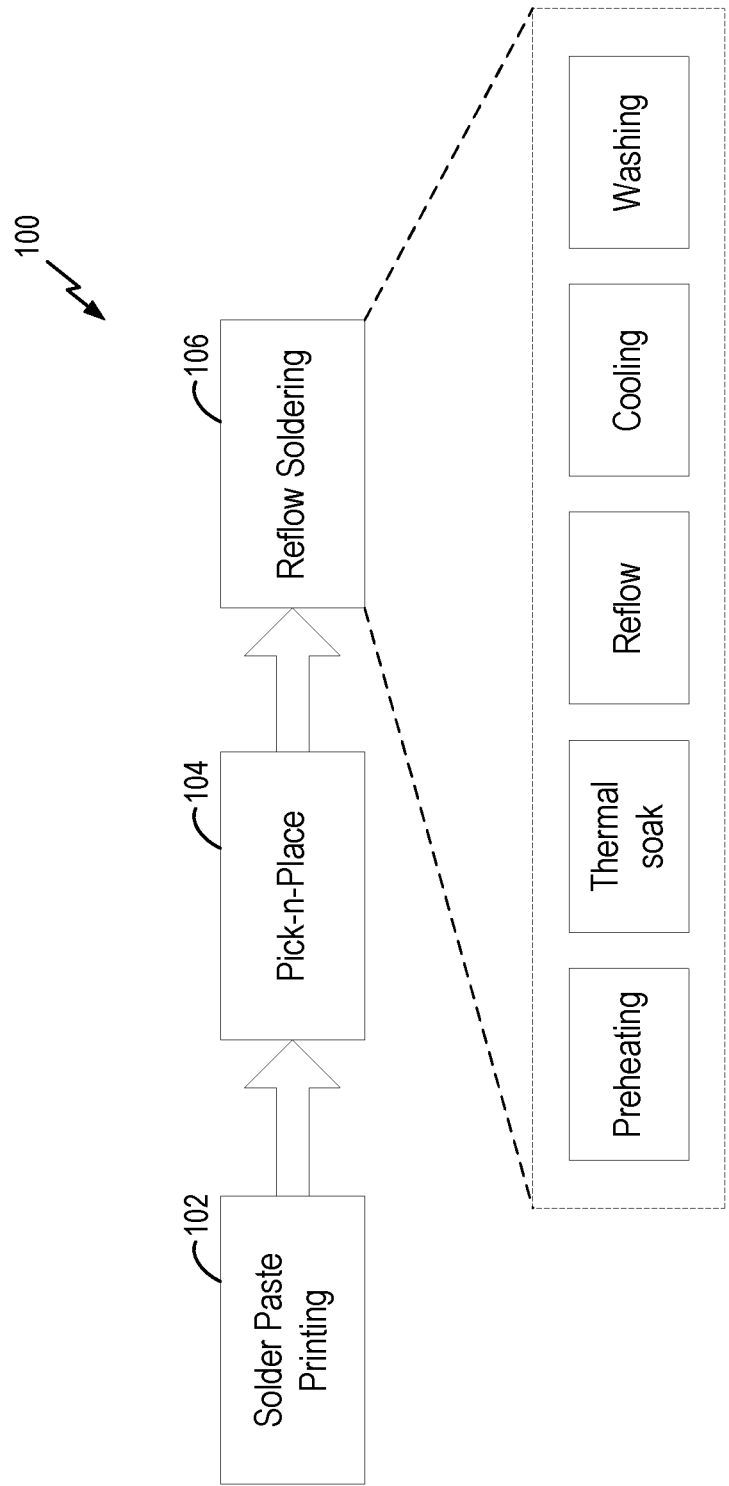
FIG. 1 is a drawing illustrating an exemplary "surface mount technology" (SMT) circuit board assembly process.

Referring now to the drawings, a pallet and a method for supporting a printed circuit board (PCB) during a circuit board assembly process are illustrated. In the illustrated embodiments, a pallet is equipped with movable tooling pins that can secure a PCB panel on the pallet without introducing a gap between the PCB panel and a solder printing stencil.

FIG. 1 is a drawing illustrating an exemplary circuit board assembly process 100 using "surface mount technology" (SMT) reflow soldering. During this process 100, a panel of PCBs move through a series of equipment or stations where various components are mounted or placed onto the panel. A PCB panel may be placed on a pallet or carrier for the purpose of providing mechanical support and reducing panel warpage. A PCB panel may simply be called a PCB in this specification. Referring to FIG. 1, in a solder paste printing machine 102, solder paste is printed onto a bare PCB panel. Solder paste may be a mixture of tiny particles of solder alloy and flux vehicle. In later processes, the solder paste printed on the PCB is melted to form the electrical and physical connections between components and the PCB panel.

After solder paste printing, the panel is transferred to a pick-n-place machine 104 (e.g., an SMT component placement system). The pick-n-place machine 104 may be a robotic machine that can automate the placement of circuit components onto the PCB panel. Some examples of components are electronic components, surface-mount devices, capacitors, resistors, integrated circuits, connectors, and the like.

After the pick-n-place machine 104, the PCB panel is transferred to a solder reflow oven 106 or the like. The solder reflow oven 106 may have multiple zones for performing different functions, for example, preheating, thermal soak, reflow, cooling, and washing. In the preheating zone, the temperature of the PCB is increased slowly to a predetermined temperature. Slowly increasing the temperature promotes uniform heat distribution throughout the PCB to avoid board warpage. For example, the temperature may be raised by about 3 to 5 degrees Fahrenheit (° F.) per second.

In the thermal soak zone, the PCB is maintained at a certain temperature for a predetermined period (e.g., 1 to 2 minutes) to ensure even heat distribution. During this time, chemicals in the solder paste may be activated to prevent the solder from turning into microbeads that are not desirable. After thermal soak, the PCB is in a thermal equilibrium state. In the reflow zone, the PCB is rapidly heated to a predetermined temperature to fully melt the solder and bond it to the PCB and components forming electrical and mechanical connections. For example, convection heating may be used to heat up the PCB and solder. In some embodiments, other heating methods may be used. In the reflow stage, timing is controlled such that the solder can melt fully without having time to flow off the PCB or start vaporizing. In some examples, the reflow process may take about 30 to 40 seconds.

In the cooling zone, the PCB is quickly cooled down to promote formation of a crystalline structure in the solder joints which create a superior bond to the underlying PCB. For example, the PCB may be cooled down to about 86° F. at a rate faster than the heating rate in the earlier zones. In the optional washing zone, chemical residue and microscopic grit may be washed away from the PCB.

Figure 2:
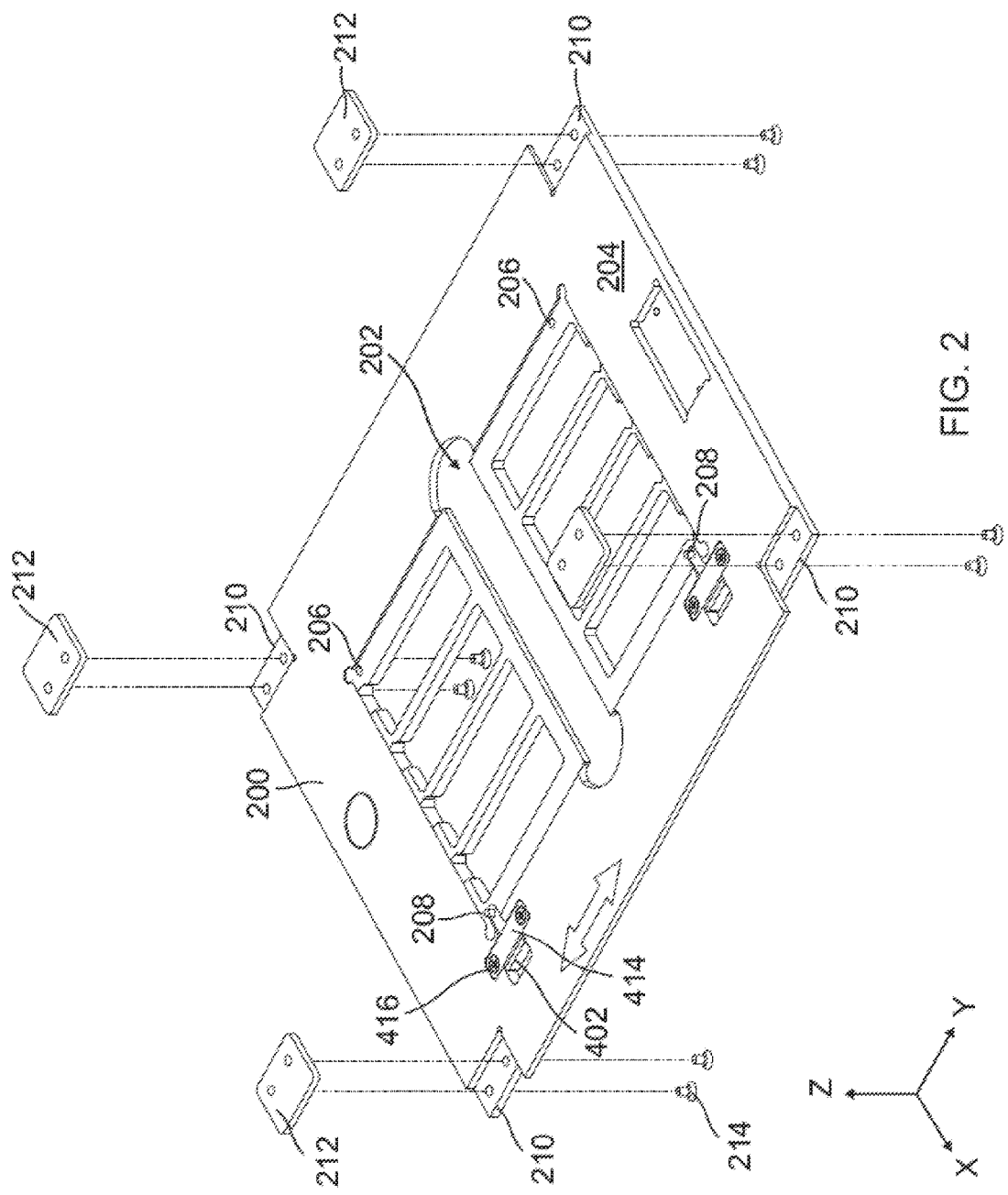
FIG. 2 is a drawing illustrating an exemplary pallet for holding a PCB panel according to an embodiment.

FIG. 2 is a drawing illustrating a perspective view of an exemplary pallet 200 for holding a PCB panel according to an embodiment. For example, the pallet 200 may be used in the PCB assembly process 100 described above. In other examples, the pallet 200 may be used to secure a PCB for other purposes, for example, troubleshooting or servicing a PCB assembly. The pallet 200 may have a rectangular shape having a long side and a short side. The dimensions shown in FIG. 2 are only illustrative in nature. In other embodiments, the pallet 200 may have other shapes and sizes as needed for carrying PCB panels of various sizes and shapes.

A central region of the pallet 200 may have a recess or cavity 202 for holding a PCB panel such that when the PCB panel is placed in the recess, its surface is substantially flush with the top surface 204 of the pallet. The recess 202 may be called a depression area, and the area surrounding the depression area may be called a frame area. The dimensions (e.g., width, depth, and length) of the recess generally conform to the shape and dimensions of the PCB panel. That is, the width, depth, and length of the recess 202 may be substantially the same as those of the PCB panel, though slightly larger to receive the PCB. When the PCB is placed in the recess, the top surface of the PCB is ideally flush with the top surface 204 of the pallet 200. Thus, the depth of the recess is substantially the same as the thickness of the PCB panel, though slightly greater to receive the PCB while ensuring the top surface 204 is flush with the top surface of the PCB. In some examples, the pallet 200 may be made from a composite material, reinforced plastic type material, electrostatic PCB material, composite delmat material that is electrostatic-neutral and chemically stable.

In some embodiments, the recess 202 or depression area may have one or openings for exposing the bottom surface of the PCB panel to allow double-sided reflow soldering. In this example, eight rectangular openings are shown in FIG. 2 for accommodating a panel of eight PCBs. The pallet 200 has two fixed tooling pins 206 and two movable tooling pins 208. The tooling pins may be called dowels, rods, or other similar terms. The movable tooling pins 208 will be described in more detail below in relation to FIGS. 3 and 4. The tooling pins may also be called guide pins that aid in the alignment and placement of the PCB panel into the recess of the pallet 200. In other embodiments, the pallet 200 may have more or less number of tooling pins.

In some embodiments, the pallet 200 may have a cutout and/or a recess area 210 at each corner for installing a bumper 212 at each corner. The bumpers 210 can protect the pallet 200 from physical damage when the pallet is transferred and handled during the PCB assembly process. The bumpers 212 may be made of a material (e.g., metal) that is stronger than the material used to make the pallet 200. In some embodiments, a pallet may not have the bumpers 212. The bumpers 212 may be secured to the pallet 200 using screws 214, fasteners, or other methods that can withstand the environment of reflow soldering.

In the related art, the PCB panel may be secured in a pallet using adhesive tapes that are manually applied by a human operator on the corners of the PCB panel. However, there are two issues with this method. The tapes add certain thickness (e.g., 0.10 mm) on top of the PCB panel protruding upward. Therefore, a gap is introduced between a solder paste printing stencil and the PCB panel. The gap can cause solder paste misprint and affect the yield of the assembly process. Moreover, the manual application of adhesive tapes onto the PCB panel and pallet can accidentally cover the PCB panel's fiducial marks, which are alignment marks used for surface mount assembly machines. Embodiments of the present disclosure provide a pallet that can avoid the use of adhesive tapes to secure a PCB panel.

Figure 3:
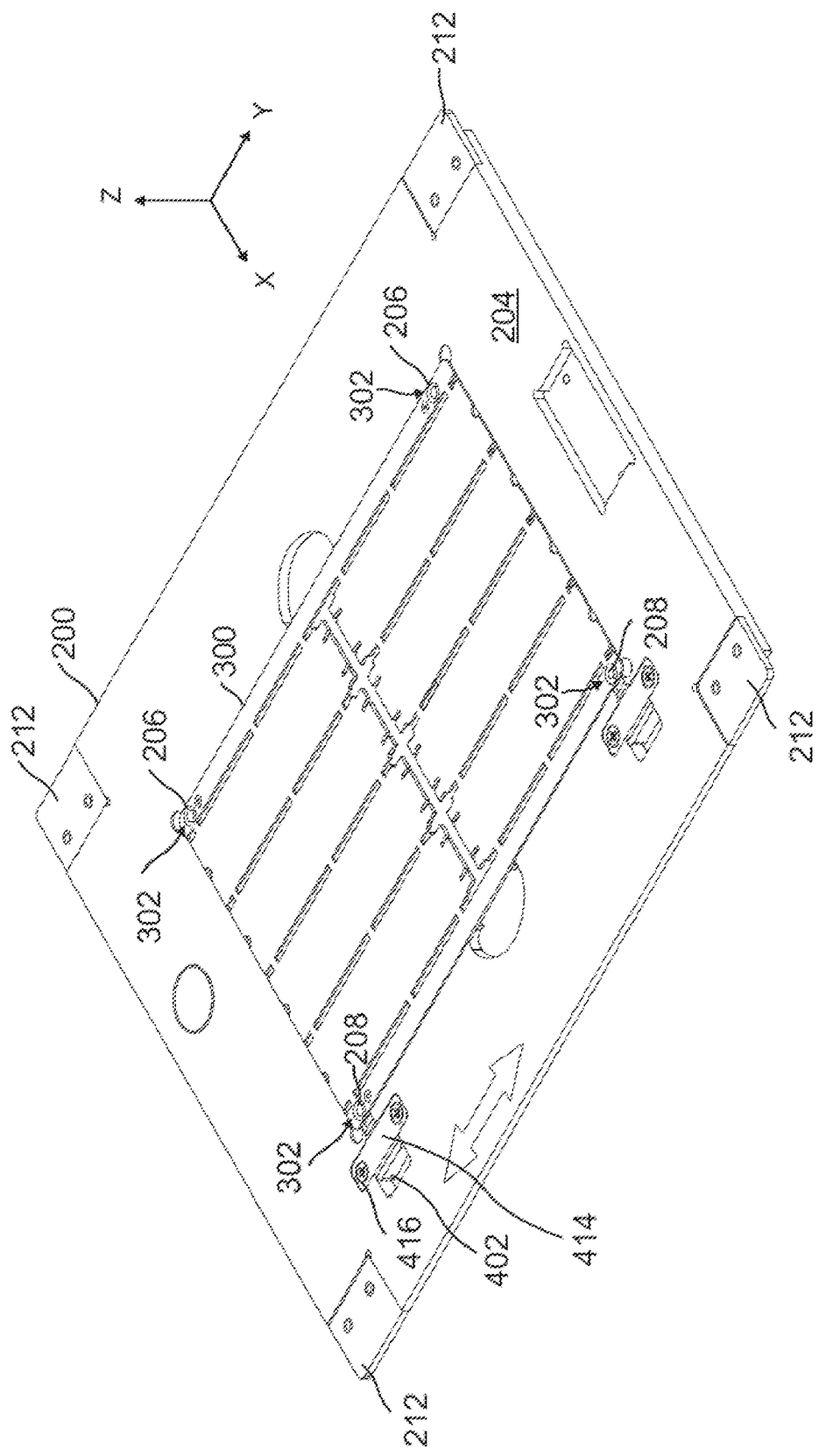
FIG. 3 is a drawing illustrating the pallet of FIG. 2 holding a PCB panel with movable tooling pins according to one embodiment.

FIG. 3 is a drawing illustrating the pallet 200 holding a PCB panel 300 in the depression area or recess 202 according to one embodiment. The PCB panel 300 may have tooling holes 302 for receiving the tooling pins of the pallet 200. Two of the tooling pins 208 (see FIG. 2) are movable and configured to secure the PCB panel 300 during the PCB assembly process without using adhesive tapes.

Figure 5:
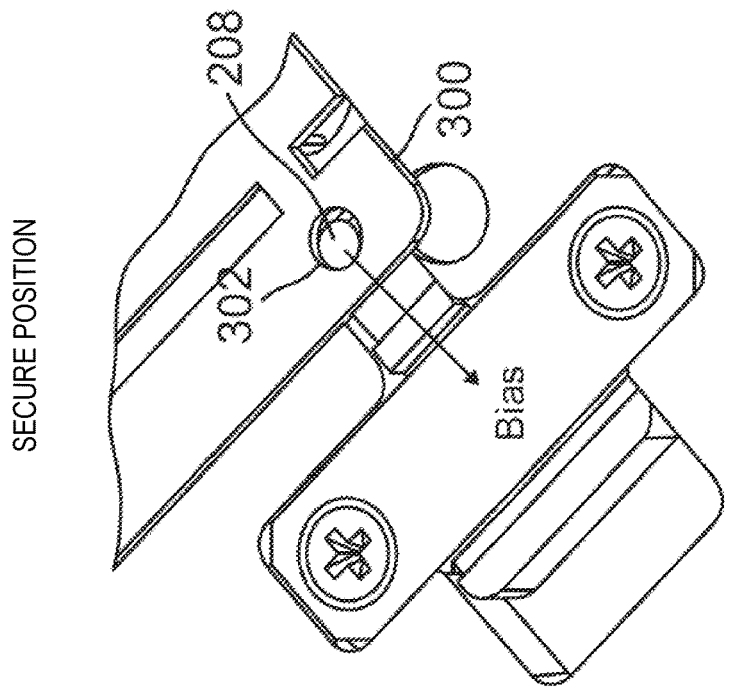
FIGS. 4 and 5 are drawings illustrating a movable pin in a release position and a secure position according to one embodiment.
Figure 4:
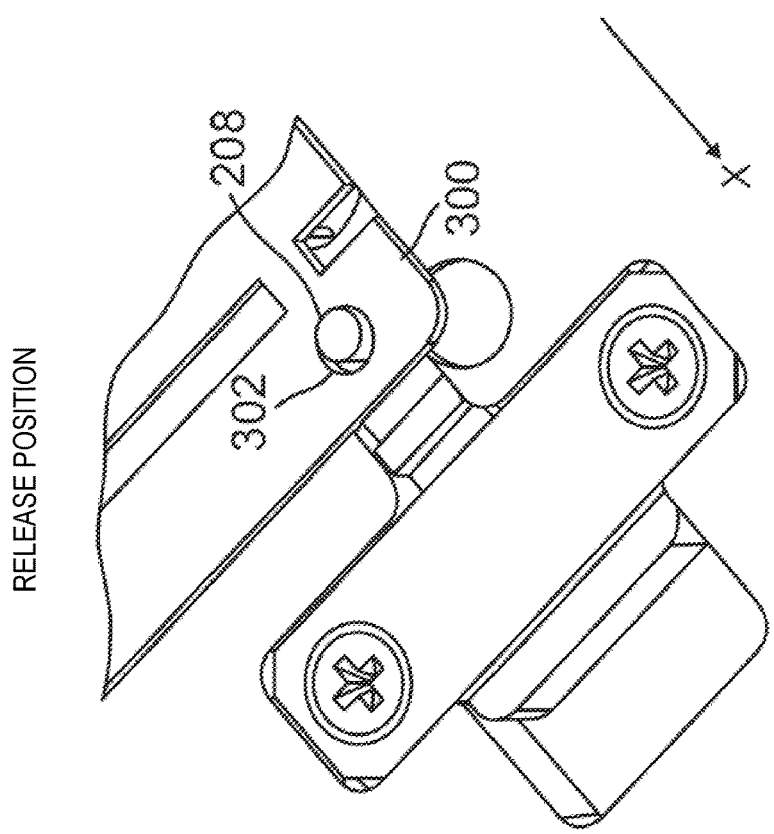

FIGS. 4 and 5 are drawings illustrating a movable tooling pin 208 in a release position and a secure position according to one embodiment. To install the PCB panel 300 into the recess 202 (i.e., panel holding space) of the pallet 200, the tooling holes of the PCB are aligned and centered with the tooling pins such that the tooling pins can easily slide through the tooling holes. The tooling pins extend upward from the top surface of the pallet 200, and the movable tooling pins 208 are movable in a direction that is substantially parallel to the planar direction of the pallet. In FIGS. 2-5, the upward direction is the Z direction, and the planar direction extends in the X and Y directions. In this example, the movable tooling pins 208 can move in a translational motion in the X direction between a release position as shown in FIG. 4 and a secure position as shown in FIG. 5. In the release position, the movable tooling pin 208 can be centered or aligned with the tooling hole 302 of the PCB such that the movable tooling pin 208 can easily slide through the tooling hole 302. In the secure position, the movable tooling pin 208 pushes or biases against the tooling hole 302 in the X direction (e.g., shown as the dashed arrow in FIG. 5 toward an outside edge of the pallet) such that the PCB panel 300 can be held and secured in the pallet 200 by the increased friction between the tooling pins and tooling holes.

In one embodiment, the movable tooling pin 208 is a part of a tooling pin assembly that is installed in the pallet 200.

Figure 6:
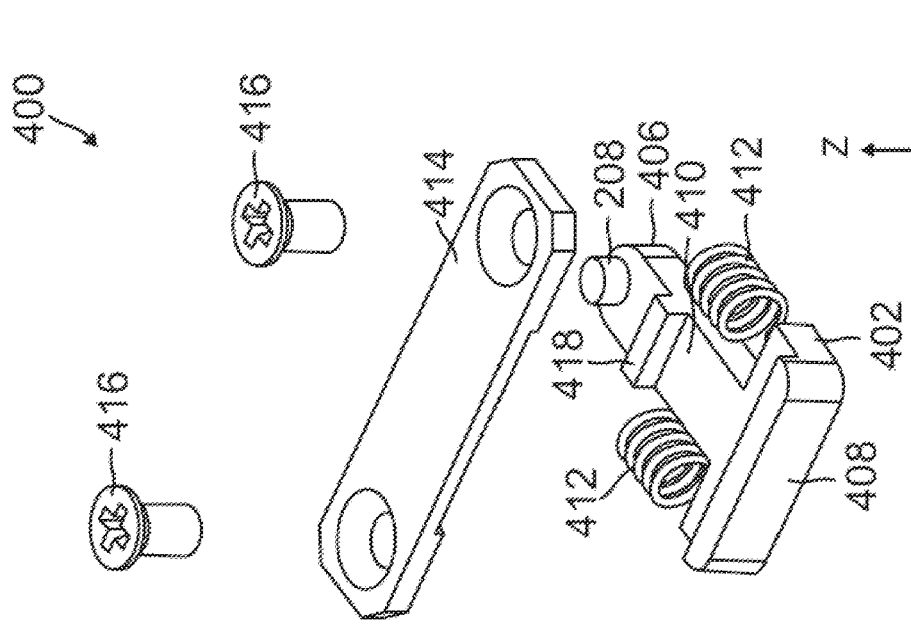
FIG. 6 is a drawing illustrating an exploded view of a tooling pin assembly according to one embodiment.

FIG. 6 is a drawing illustrating an exploded view of a tooling pin assembly 400 according to one embodiment. The tooling pin assembly 400 includes a base 402 that can slide or move in a translational motion in a cavity or slot of the pallet 200.

Figure 7:
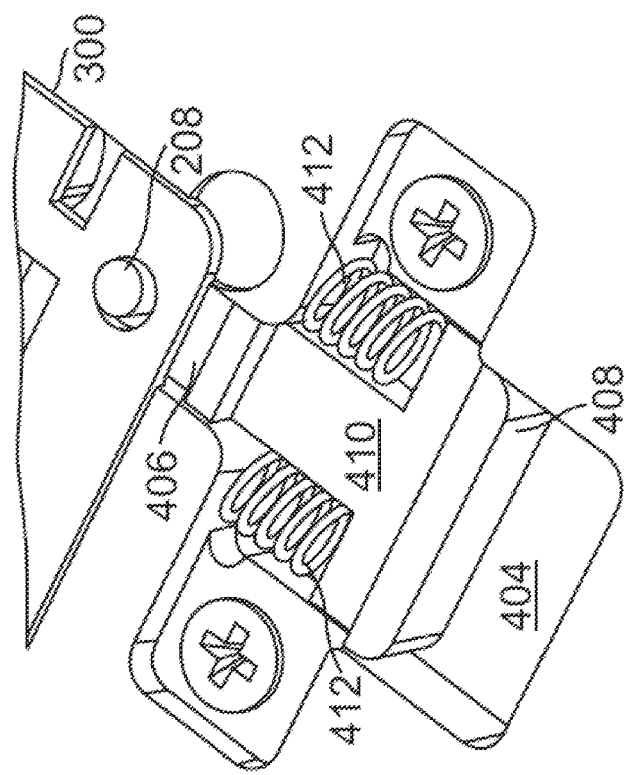
FIG. 7 is a drawing illustrating the tooling pin assembly of FIG. 6 installed in a cavity of a pallet according to one embodiment.

FIG. 7 is a drawing illustrating the base 402 installed into a cavity 404 of the pallet 200 (partially shown in FIG. 7) according to one embodiment. The base 402 may be made of metal or other materials that can withstand a solder reflow environment. The base 402 has an inside end (PCB end) 406 and an outside end 408 that is opposite to the inside end. The movable tooling pin 208 extends from a top surface of the PCB end 406 upward in the Z direction. A middle section 410 of the base 402 and the PCB end 406 may have a thickness less than the outside end 408 in the Z direction shown in FIG. 6. The outside end 408 may be wider than the middle section 410 and PCB end 406 in the Y direction as shown in FIG. 6.

The cavity 404 of the pallet 200 has a narrow section and a wide section. The narrow section is dimensioned to receive the PCB end 406 of the base, and the wide section is dimensioned to receive the outside end 408 of the base. The narrow section extends below the PCB panel 300 when it is installed. The tooling pin assembly 400 may include two springs 412 (biasing elements or members). The two springs 412 are installed on opposite sides of the middle section 410 between the outside end 408 and an inside wall of the cavity 404. In other embodiments, the springs may be replaced by other biasing elements, mechanisms, or elastic members or objects that can be compressed to store mechanical energy. After the movable base 402 and springs 412 are installed into the cavity 404, a bracket 414 is secured across a section of the cavity 404 on top of the base 402 to prevent the base 402 and springs 412 from popping out of the cavity 404 during operation. In some examples, the bracket 414 may be secured to the pallet 200 by screws 416 or other fasteners and/or methods.

Figure 8:
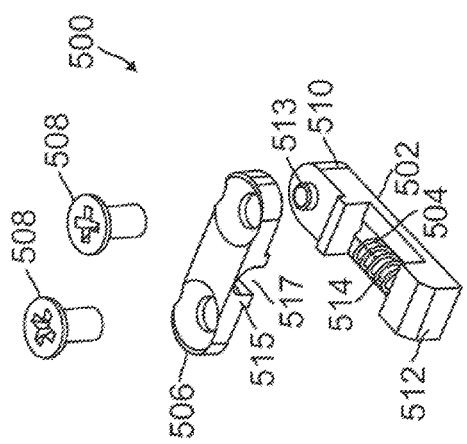
FIG. 8 is a drawing illustrating an exploded view of a tooling pin assembly according to another embodiment.

FIG. 8 is a drawing illustrating an exploded view of an exemplary tooling pin assembly 500 according to another embodiment. The tooling pin assembly 500 includes a base 502, a spring 504, a bracket 506, and two screws 508. Similar to the other embodiment shown in FIGS. 4-7, the base 502 has an inside end 510 (PCB end) and an outside end 512. A movable tooling pin 513 extends upward from a top surface of the inside end 510. The spring 504 is attached to the outside end 512 and extends toward the inside end 510. A shaft, pin, or dowel 514 may extend from the outside end 512 toward the inside end 510. The spring 504 may be attached and secured on the shaft 514 by compression or friction. In one embodiment, the shaft 514 may have a traditional cylindrical shape or any other suitable shapes. In some embodiments, the shaft and spring may be replaced by other biasing mechanisms or an elastic object that can be compressed to store mechanical energy.

Figure 10:
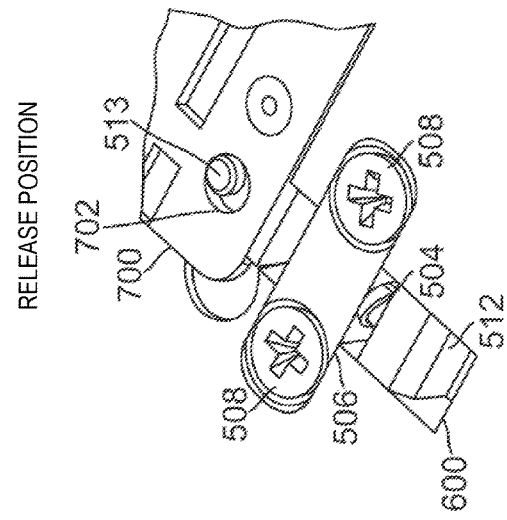
FIGS. 9 and 10 are drawings illustrating the tooling pin assembly of FIG. 8 installed in a pallet according to one embodiment.
Figure 9:
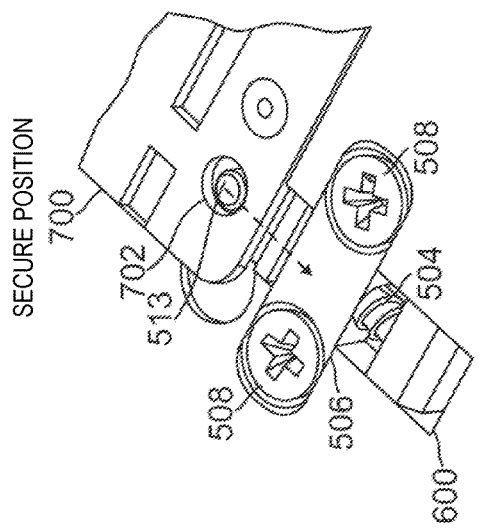

FIGS. 9 and 10 are drawings illustrating the tooling pin assembly 500 installed into a pallet according to one embodiment. The pallet (partially shown in FIGS. 9 and 10) may be similar to the pallet 200 and have a cavity 600 or slot for receiving the tooling pin assembly 500. The cavity 600 is dimensioned to allow the base 502 to move in a translational motion. A section of the cavity 600 extends below a PCB panel 700 when it is installed. After the base 502 and spring 504 are installed into the cavity 600, the bracket 506 is fastened across a section of the cavity 600 on top of the base 502 to prevent the base 502 and spring 504 from popping out of the cavity 600 during operation. In some examples, the bracket 506 may be secured to the pallet 200 by the screws 508 or other fasteners and/or methods.

When the base 502 is pushed in the cavity 600 toward the PCB panel 700 in the release position, the movable pin 513 can be centered and aligned with the tooling hole 702. In the release position, the spring 504 is compressed between the outside end 512 and a side wall 515 of the bracket 506 facing the outside end 512. The bracket 506 may have a cutout 517 that allows the shaft 514 to pass through when the spring 504 is compressed. In another embodiment, in the release position, the spring 504 is compressed between the outside end 512 and a second side wall (e.g., retaining wall 520 in FIG. 11) of the bracket 506 facing the outside end 512. In such case, the bracket cutout 517 allows the shaft 514 and a portion of the spring 504 to pass through when the spring 504 is compressed. In another embodiment, the spring 504 may not pass through the cutout 517. When movable base 502 is released from the release position, the spring 504 expands and pushes the base 502 away from the PCB panel 700 such that the moveable tooling pin 513 pulls or biases the PCB panel's tooling hole 702 in a direction toward the edge of the pallet. This pulling mechanism increases the friction between the tooling pins and the tooling holes such that the PCB panel 700 can be securely held in the pallet without using adhesive tapes.

Figure 12:
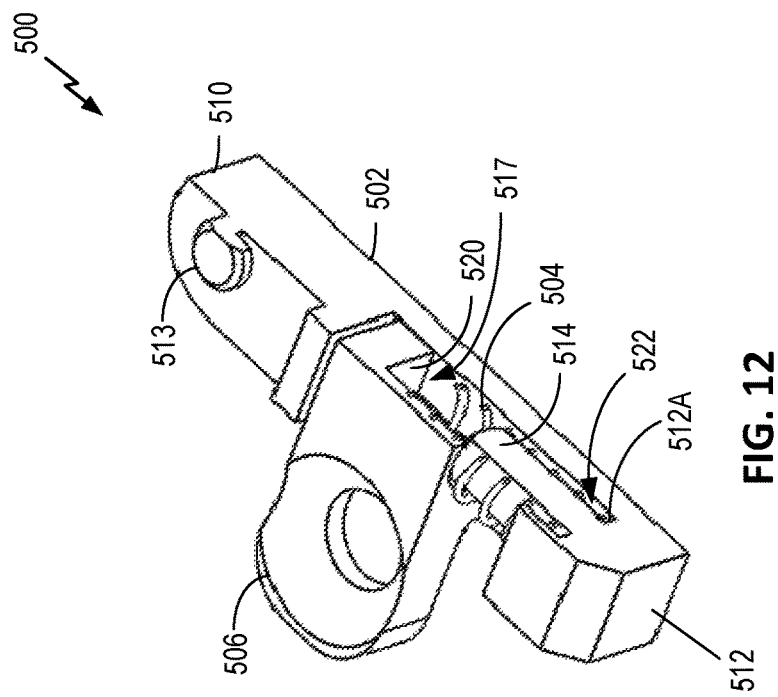
FIGS. 11 and 12 are drawings illustrating the tooling pin assembly of FIG. 8 in a perspective view and a cutout perspective view according to one embodiment.
Figure 11:
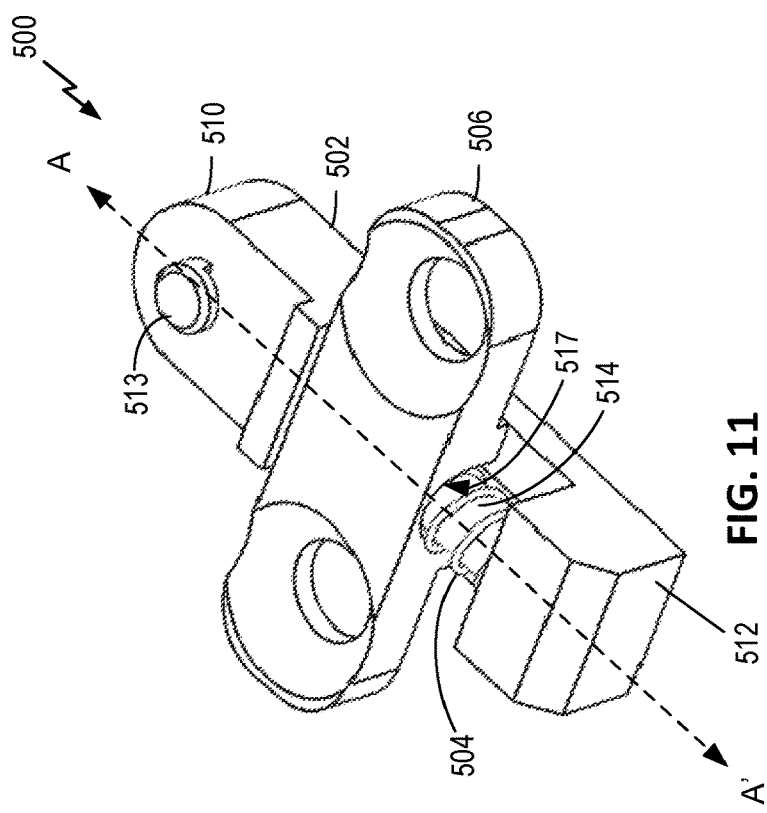

FIGS. 11 and 12 are drawings illustrating the tooling pin assembly 500 in a perspective view and a cutout perspective view along the line A-A'. In this embodiment, a portion of the spring 504 is secured in the cutout 517 of the bracket 506. In the release position, the spring 504 may be compressed by an interior spring retaining wall 520 that it disposed within the cutout 517 and an interior wall 512a in a recess portion 522 of the outside end 512. In the illustrated example, the interior spring retaining wall 520 is disposed at a point that is about two-thirds of the way along the length of the cutout 517. In other examples, the interior spring retaining wall 520 may be disposed at another suitable point along the length of the cutout 517. The recess portion 522 of the outside end 512 may have a circular hollow cylinder like shape (e.g., where the hollow portion is replaced by the shaft 514) sized to receive and retain an end of the spring 504.

Figure 13:
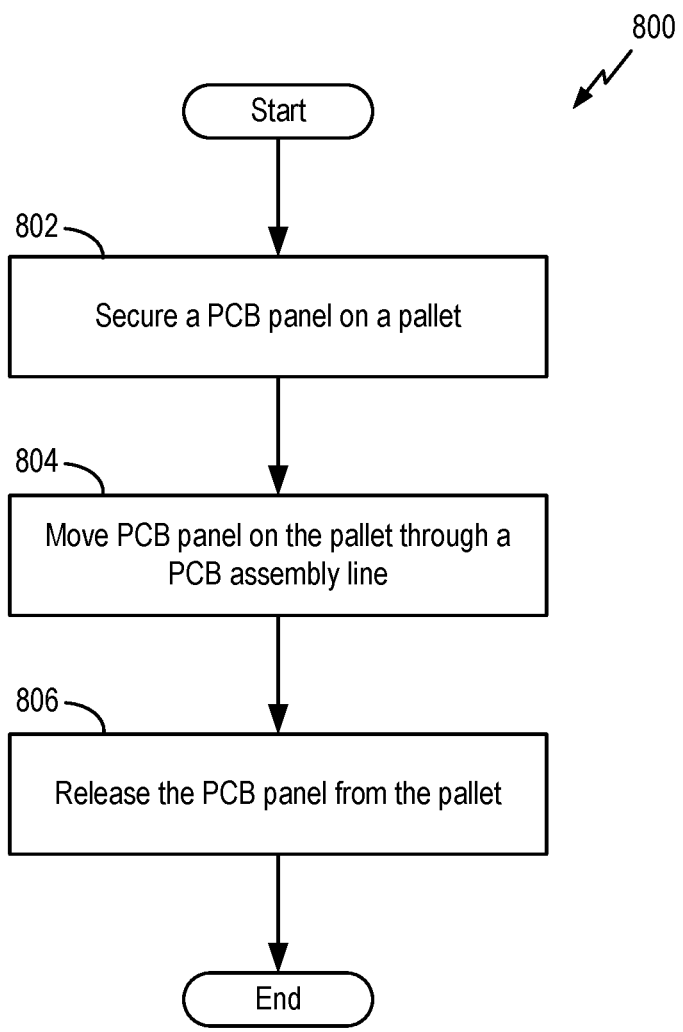
FIG. 13 is a flow chart illustrating a PCB assembly process using a pallet according to some embodiments.

FIG. 13 is a flow chart illustrating a PCB assembly process 800 using a pallet according to some embodiments. At block 802, a PCB panel is secured on a pallet using the method 900 described in relation to FIG. 14 below. For example, the pallet may be any one of the pallets illustrated in FIGS. 2-10. The PCB panel may be secured using one or more movable tooling pins as described above in relation to FIGS. 2-10. For example, an operator may set the movable tooling pins to a release position to align and/or center the tooling pins with the corresponding tooling holes of the PCB panel. Therefore, the tooling pins can easily slide through the tooling holes of the PCB panel when it is placed in the recess of the pallet. Then the operator can set the movable tooling pins to a secure position as described above in relation to the drawings.

At block 804, the PCB panel now secured on the pallet can go through a PCB assembly line that may perform the PCB assembly process 100 of FIG. 1 or other similar processes. At block 806, the operator may release the PCB panel from the pallet. For example, the operator may set the movable tooling pins to a release position so that the PCB panel may be released from the pallet. In the release position, the tooling pins can easily slide out from the tooling holes of the PCB panel.

In some embodiments, the process 800 may be automated such that the PCB panel can be installed in and released from the pallet without involving a human operator. For example, the handling of the PCB panel and operation of the moveable tooling pins may be performed using robotic arms.

Figure 14:
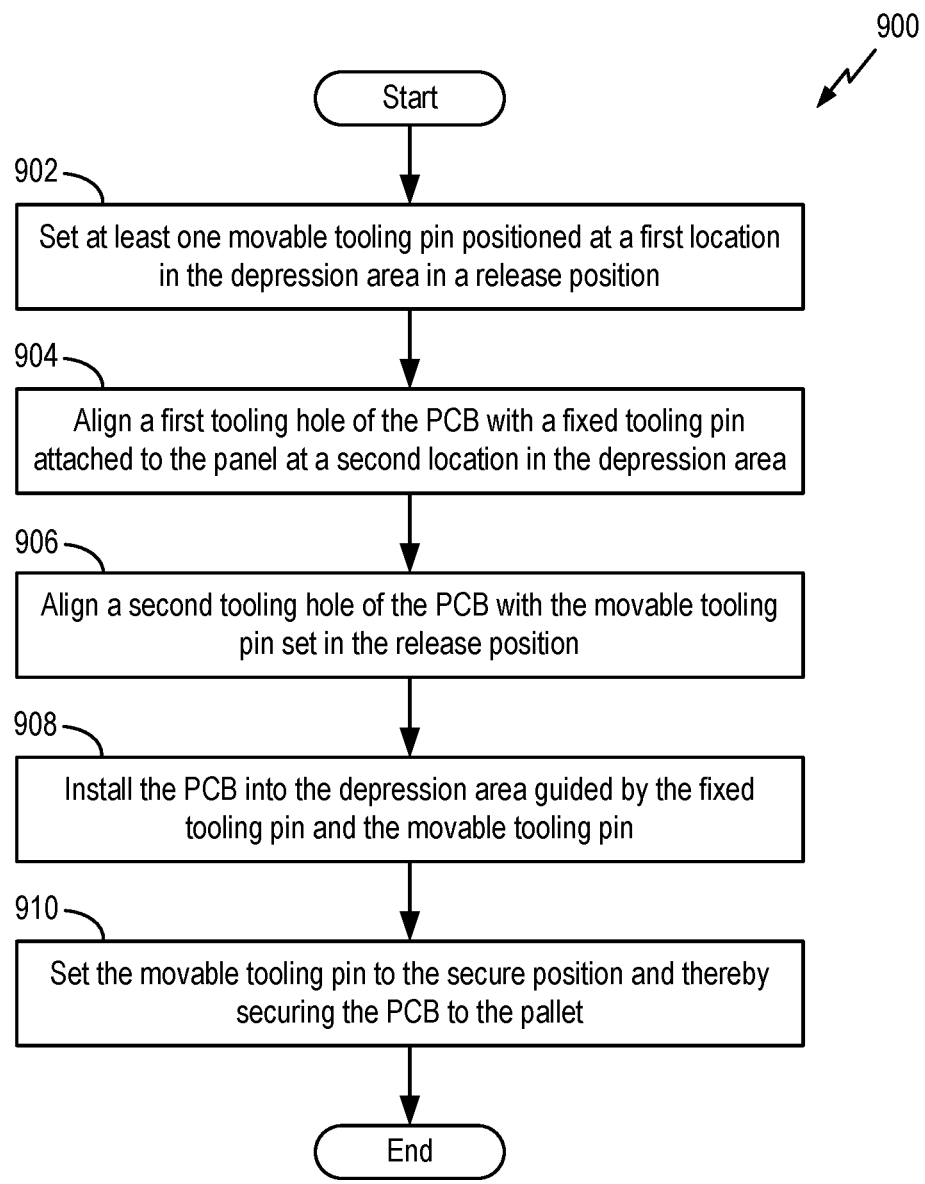
FIG. 14 is a flow chart illustrating a method for securing a PCB using a pallet according to some embodiments.

FIG. 14 is a flow chart illustrating a method 900 for securing a PCB using a pallet according to some embodiments. The pallet may include a panel having a frame area surrounding a depression area for receiving a PCB as described above in relation to FIGS. 2-10. At block 902, the method sets at least one movable tooling pin of the pallet positioned at a first location in the depression area in a release position. At block 904, the method aligns a first tooling hole of the PCB with a fixed tooling pin attached to the panel at a second location in the depression area. At block 906, the method aligns a second tooling hole of the PCB with the movable tooling pin set in the release position. At block 908, the method installs the PCB into the depression area that are guided by the fixed tooling pin and the movable tooling pin. At block 910, the method sets the movable tooling pin to the secure position and thereby securing the PCB to the pallet.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner Tasks or events may be added to or removed from the disclosed example embodiments. The example systems and components described herein may be configured differently than described. For example, elements may be added to, removed from, or rearranged compared to the disclosed example embodiments.

What is claimed is:

1. A pallet for supporting a printed circuit board (PCB) in a PCB assembly process, comprising:
    a panel having a frame area surrounding a depression area for receiving a PCB;
    at least one fixed tooling pin attached to the panel at a first location in the depression area; and
    at least one tooling pin assembly comprising:
        a base having a first end and a second end;
        a biasing element between the first end and the second end; and
        a movable tooling pin protruding from the first end of the base,
            wherein the movable tooling pin is positioned at a second location in the depression area, and movable between a release position for installing the PCB in the depression area and a secure position for securing the PCB in the depression area, and
            wherein the second end is configured to apply a compression force to the biasing element when the movable tooling pin is at the secure position.

2. The pallet of claim 1, wherein the movable tooling pin in the secure position biases the PCB, at a first tooling hole of the PCB, in a first direction toward an outside edge of the panel.

3. The pallet of claim 2, wherein the fixed tooling pin biases the PCB, at a second tooling hole of the PCB, in a second direction that is opposite to the first direction.

4. The pallet of claim 1, wherein the biasing element comprises an elastic member configured to push the base to move in a translational motion.

5. The pallet of claim 4, wherein when the movable tooling pin is at the release position, the elastic member is compressed to an extent greater than when the movable tooling pin is at the secure position.

6. The pallet of claim 1, wherein the panel further comprises a cavity partially underneath the PCB for receiving the base of the tooling pin assembly and guiding the base in a direction of a translational motion.

7. The pallet of claim 6, wherein the cavity comprises a first section and a second section that is wider than the first section.

8. The pallet of claim 1, wherein the tooling pin assembly further comprises:
    a bracket positioned across the base in a first direction for retaining the base during a translational motion in a second direction that is perpendicular to the first direction.

9. A pallet for supporting a printed circuit board (PCB) in a PCB assembly process, comprising:
    a panel having a frame area surrounding a depression area for receiving a PCB, and a cavity partially underneath the PCB;
    at least one fixed tooling pin attached to the panel at a first location in the depression area;
    a tooling pin assembly comprising:
        a base having a first end and a second end, the base received in the cavity of the panel and guided by the cavity in a direction of a translational motion;
        a biasing element between the first end and the second end;
        a movable tooling pin protruding from the first end of the base, wherein the movable tooling pin is positioned at a second location in the depression area, the movable tooling pin being movable between a release position for installing the PCB in the depression area and a secure position for securing the PCB in the depression area; and
    a bracket positioned across the cavity for retaining the tooling pin assembly in the cavity during the translational motion.

10. The pallet of claim 9, wherein the biasing element is compressed by the bracket and the second end of the base when the movable tooling pin is at the release position.

11. A pallet for supporting a printed circuit board (PCB) in a PCB assembly process, comprising:
    a panel having a frame area surrounding a depression area for receiving a PCB;
    at least one fixed tooling pin attached to the panel at a first location in the depression area; and a tooling pin assembly comprising:
  a base having a first end, a second end, and a middle section between the first end and the second end;
  a movable tooling pin protruding from the first end of the base, wherein the movable tooling pin is positioned at a second location in the depression area, and movable between a release position for installing the PCB in the depression area and a secure position for securing the PCB in the depression area; and
  a first biasing element and a second biasing element on opposite sides of the middle section, the first biasing element and the second biasing element configured to be compressed by the second end of the base when the movable tooling pin is in the release position.

12. The pallet of claim 11, wherein the second end is wider than the first end.

13. The pallet of claim 11, wherein the base has a T shape.

* * * * *